United States Patent
Hahn

(10) Patent No.: US 6,482,717 B1
(45) Date of Patent: Nov. 19, 2002

(54) METHOD OF MANUFACTURING A SEMICONDUCTOR DEVICE INCLUDING FORMING WELL COMPRISING EPI IN TRENCH

(75) Inventor: Seung Ho Hahn, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/016,762

(22) Filed: Dec. 10, 2001

(30) Foreign Application Priority Data

Apr. 30, 2001 (KR) ......................................... 2001-23400

(51) Int. Cl.[7] .............................................. H01L 21/76

(52) U.S. Cl. ........................ 438/429; 438/429; 438/427

(58) Field of Search .................................. 438/429, 427

(56) References Cited

U.S. PATENT DOCUMENTS

| | | | |
|---|---|---|---|
| 4,528,047 A | * | 7/1985 | Beyer et al. |
| 4,689,656 A | * | 8/1987 | Silvestri et al. |
| 5,236,863 A | * | 8/1993 | Iranmanesh |
| 6,103,594 A | * | 8/2000 | See et al. |
| 6,177,332 B1 | * | 1/2001 | Chen et al. |
| 6,306,723 B1 | * | 10/2001 | Chen et al. |

OTHER PUBLICATIONS

Xiang et al. "Sidewall faceting and inter–facet mass transport in selectively grown epitaxial layers on $SiO_2$–maksed Si(110) substrates"; Journal of crystal growth 175/176 (1997); pp. 469–472.*

H. Koga, et al. "Two–Dimensional Borderless Contact Pad Technology for a 0.135 $\mu m^2$ 4–Gigabit DRAM Cell," *IEEE Proceedings*, (1997), pp. 2.1.1–2.1.4.

Y. Mitani, I. Mizushima, S. Kambayashi, H. Koyama, M.T. Takagi, and M. Kashiwagi; "Buried Source and Drain (BSD) Structure for Ultra–Shallow Junction using Selective Deposition of Highly Doped Amorphous Silicon"; *Symposium on VLSI Technology Digest of Technical Papers*, 1996, pp. 176–177.

(List continued on next page.)

Primary Examiner—John F. Niebling
Assistant Examiner—Ron Pompey
(74) Attorney, Agent, or Firm—Ladas & Parry

(57) ABSTRACT

A method for fabricating a semiconductor device by one masking process using selective epitaxial growth, comprising the steps of providing a first conductive silicon substrate having an active region and field regions thereon and having a formed pad oxide layer on the surface, forming a trench having a width including the active region and field regions at both sides of the active region by etching the pad oxide layer and silicon substrate, forming a spacer having a width similar to that of the field region at both sidewalls of the trench and exposing active region of the silicon substrate, forming a second conductive well on the exposed active region of the silicon substrate by growing an in-situ doped silicon epi layer to a height similar to a surface of the silicon substrate, depositing an oxide layer on the resultant structure to fill a gap between the spacer and the well and performing planarization of the oxide layer to expose a surface of the silicon substrate and to form isolation layers at both sides of the well.

20 Claims, 4 Drawing Sheets

OTHER PUBLICATIONS

Carlos Mazuré, Jon Fitch and Craig Gunderson; "Facet Engineered Elevated Source/Drain By Selective Si Epitaxy For 0.35 Micron Mosfets"; *IEEE Proceedings*, 1992; vol. 4 pp. 33.7.1–33.7.4.

Jie J. Sun and Carlton M. Osburn; "Impact of Epi Facets on Deep Submicron Elevated Source/Drain MOSFET Characteristics"; *IEEE Transactions on Electron Devices*; vol. 45. No. 6, 1998, pp. 1377–1380.

Kiyotaka Miyano, Ichiro Mizushima, Kazuya Ohuchi, Akira Hokazono, and Yoshitaka Tsunashima; "Face–Free Si Selective Epitaxial Growth Adaptable to Elevated Source/Drain MOSFETs with Narrow STI"; *Extended Abstracts of the 1998 International Conference on Solid State Devices and Materials Hiroshima*, 1998, pp. 420–421.

Jung Ho Lee, Kil Ho Lee, In Seok Yeo and Sahng Kyoo Lee; "Strained Growth Behavior of Selective Silicon Epitaxy in Confined Structures"; *Journal of the Korean Physical Society*, vol. 33, 1998, pp. S302–S304.

Tatsuya Ohguro, Keisaku Yamada, Naoharu Sugiyama, Seiji Imai, Kouji Usuda, Takashi Yoshitomi, Claudio Fiegna, Mizuki Ono, Masanobu Saito, Hisayo Sasaki Momose, Yasuhiro Katsumata, and Hiroshi Iwai; "0.15– $\mu$m Buried–Channel p–MOSFET's with Ultrathin Boron–Doped Epitaxial Si Layer"; *IEEE Transactions on Electron Devices*, vol. 45, No. 3; 1998, pp. 717–721.

Tatsuya Ohguro, Naoharu Sugiyama, Seiji Imai, Kouji Usuda, Masanobu Saito, Takashi Yoshitomi, Mizuki Ono, Hideki Kimijima, Hisayo Sasaki Momose, Yasuhiro Katsumata, and Hiroshi Iwai; "Undoped Epitaxial Si Channel n–MOSFET Grown by UHV–CVD with Preheating"; *IEEE Transactions on Electron Devices*, vol. 45, No. 3, 1998, pp. 710–716.

Kenji Noda, Toru Tatsumi, Tetsuya Uchida, Ken Nakajima, Hidenobu Miyamoto, and Chenming Hu; "A 0.1–$\mu$m Delta–Doped MOSFET Fabricated with Post–Low–Energy Implanting Selective Epitaxy"; *IEEE Transactions on Electron Devices*, vol. 45, No. 4, 1998, pp. 809–814.

J. Sun, R.F. Bartholomew, K. Bellur, A. Srivastava, C.M. Osburn, N.A. Masnari; "A Comparative Study of n+/p Junction Formation for Deep Submicron Elevated Source/Drain Metal Oxide Semiconductor Field Effect Transistors"; *J. Electrochem. Soc.*, vol. 144, No. 10, 1997, pp. 3659–3664.

Jie J. Sun, Robert F. Bartholomew, Kashyap Bellur, Anadi Srivastava, Carlton M. Osburn, and Nino A. Masnari; "The Effect of the Elevated Source/Drain Doping Profile on Performance and Reliability of Deep Submicron MOSFET's"; *IEEE Transactions on Electron Devices*, vol. 44, No. 9, 1997, 1491–1498.

Satoshi Yamakawa, Kohei Sugihara, Taisuke Furukawa, yasutaka Nishioka, Takumi Nakahata, Yuji Abe, Shigemitsu Maruno, and Yasunori Tokuda; "Drivability Improvement on Deep–Submicron MOSFET's by Elevation of Source/Drain Regions"; *IEEE Electron Device Letters*, vol. 20, No. 7, 1999, pp. 366–368.

H. Hada, T. Tatsumi, K. Miyanaga, S. Iwao, H. Mori and K. Koyama; "A Self–Aligned Contact Technology Using Anisotropical Selective Epitaxial Silicon For Giga–Bit DRAMs" *IEEE Proceedings*, 1995, pp. 27.4.1–27.4.4.

H. Koga, N. Kasai, H. Hada, T. Tatsumi, H. Mori, S. Iwao, K. Saino, H. Yamaguchi, K. Nakajima, Y. Yamada, K. Tokunaga, S. Hirasawa, K. Yoshida, A. Nishizawa, T. Hashimoto, K. Ando, Y. Kato, K. Takemurat, and k. Koyama; "A 0.23 $\mu$m$^2$ Double Self–Aligned Contact Cell for Gigabit DRAMs With a Ge–Added Vertical Epitaxial Si Pad"; *IEEE Proceedings*, 1996, pp. 22.1.1–22.1.4.

H. Sayama, S. Shimizu, Y. Nishida, T. Kuroi, Y. Kanda, M. Fujisawa, Y. Inoue and T. Nishimura; "Low Resistance Co–Salicided 0.1 $\mu$m CMOS Technology Using Selective Si Growth"; *IEEE Proceedings*, 1999, pp. 36–39.

T. Tanaka, H. Ogawa, K. Goto, K. Itabashi, T. Yamazaki, J. Matsuo, T. Sugii and I. Yamada; "Channel Engineering using B10H14 Ion Implantation for Low Vth and High SCE Immunity of Buried–Channel PMOSFETs in 4–Gbit DRAMs and Beyond"; *IEEE, Proceedings*, 1998, pp. 2–3.

C.–P. Chao, K. E. Violette, S. Unnikrishan, M. Nandakumar, R. L. Wise, J. A. Kittl, Q.–Z. Hong and I.–C. Chen; "Low Resistance Ti or Co Salicided *Raised Source/Drain* Transistors for Sub–0.13 $\mu$m CMOS Technologies"; *IEEE Proceedings*, 1997, pp. 5.2.1–5.2.4.

Asen Asenov and Subhash Saini, "Suppression of Random Dopant–Induced Threshold Voltage Fluctuations in Sub–0.1–$\mu$m MOSFETs with Epitaxial and $\delta$–Doped Channels"; *IEEE Transactions on Electron Devices*; vol. 46, No. 8, 1999, pp. 1718–1724.

* cited by examiner

METHOD OF MANUFACTURING A SEMICONDUCTOR DEVICE INCLUDING FORMING WELL COMPRISING EPI IN TRENCH

BACKGROUND OF THE INVENTION

1. Field of the Invention

The present invention relates generally to a method of manufacturing semiconductor device and, more particularly to, a semiconductor manufacturing method advantageously applied to highly integrated semiconductor device.

2. Description of the Related Art

As the complexity of integration for semiconductor devices has increased, devices and processes for their fabrication have been changed accordingly. For example, changes are required for fabrication of well and isolation features.

First, a well is required to maintain shallow depth. In a conventional method, the well has deep depth of several $\mu$m. However, as the depth of source/drain regions has become remarkably shallow, the well also has become shallow for stabilized driving of transistor. Future well depths are expected to be shallower. For example, a transistor can be driven stably with a well having a depth of several thousands A by development of a doping method. Therefore, minimum well depths will be reduced continuously.

Second, a new method for isolation is required. As is well known, LOCOS process has been widely used for isolation; however, it has a limitation in realizing highly integrated devices. Therefore, a STI (Shallow Trench Isolation) process has been proposed as a substitute for the LOCOS process. However, in a device of less than sub-0.1 $\mu$m, problems arise because voids are generated during the gap-fill process.

Third, effective control of the amount of dopants on the interface of active region and field region is required. However, in a conventional STI process, it is impossible to isolate according to the doping type of the active region. Therefore, it is also impossible to dope in a well because of well dopant damage due to dopant shift from the active region to the field region around the active region, respectively by in the N-well and P-well. Recently, a method has been found to control the amount of P-well dopant. However, problems of N-well counter doping and N-well dopants are still unsolved. As the degree of integration has increased, inverse narrow width effects are accordingly increased. Therefore, solutions are required to solve these problems.

However, the above-mentioned integration in well and isolation features has several drawbacks.

First, a well becomes shallow as a result of development of the doping method. However, the well is formed by ion-implantation, therefore, it is impossible to avoid crystal defects due to ion implantation. Moreover, there is a problem that the profile of the dopant is not uniform, but has a slope.

Second, the STI process is advantageous to high integration, compared with the LOCOS process. However, this STI process has a limitation in devices of sub-0.1 $\mu$depths. In short, the STI process has problems of gap-fill such as void generation in filled oxide due to an increase in the trench aspect ratio and in the generation of transformation or defects in the active surface in a succeeding process due to increase surface stress in the parts thereof. Additionally, problems of lowering of transistor properties result from a decrease of carrier mobility due to stress and deterioration of transistor driving by unevenness in the oxide thickness and due to interface trap between the oxide and the substrate.

In order to solve the problems of gap-fill, research in progress has been directed to development of new materials and processes. A method for reducing the aspect ratio of a trench has been proposed in order to solve the problems; however, the proposed solutions may also result in lowering the degree of integration.

Stress during the gap-fill process is concentrated around the active region on the surface or at the bottom of the trench. It has little effect on a device having a critical size larger than sub-0.1 $\mu$m, for example, sub-0.15 $\mu$m since the active region has sufficient width. However, in the device of sub-0.1 $\mu$m, stress has a greater effect, thereby reducing carrier mobility and generating defects. As a result, electric properties are lowered, and thereby causing difficulties in selection of succeeding processes.

As the degree of integration is increased, side treatment to the interface of active region and to the field region becomes more important. It is more important in isolation by STI. For effective sidewall treatment, it is desirable that the N-well side and the P-well side be treated, respectively. However, according to the present STI, it is difficult to treat the sides respectively. As a result, effective sidewall treatment to the interface between the active region and the field region is not accomplished by the present methods and there is no effective interface treatment method for sub-0.1 $\mu$m.

SUMMARY OF THE INVENTION

Therefore, an object of the present invention is to provide a method for fabricating semiconductor devices capable of maintaining uniformity of well dopant profile while preventing crystal defects due to doping.

Another object of the present invention is to provide a method for fabricating semiconductor devices that are capable to solve the problems of gap-fill and stress in the STI process.

Still another object of the present invention is to provide a method for fabricating a semiconductor device capable of accomplishing N-well side treatment and P-well side treatment, respectively.

Moreover, still another object of the present invention is to provide a method for fabricating a semiconductor device capable of being applied to highly integrated devices by forming a shallow well and isolation layer by a masking process.

In order to accomplish the above objects, there is disclosed herein a method for fabricating semiconductor device comprising the steps of providing a first conductive silicon substrate having an active region and field regions thereon and having a formed pad oxide layer on the surface, forming a trench having a width including the active region and field regions at both sides of the active region by etching the pad oxide layer and the silicon substrate, forming a spacer having a width similar to that of the field region at both sidewalls of the trench and exposing the active region of the silicon substrate, forming a second conductive well on the exposed active region of the silicon substrate by growing an in-situ doped silicon epi layer to a height similar to a surface of the silicon substrate, depositing an oxide layer on the resultant structure to fill a gap between the spacer and the well, and performing planarization of the oxide layer to expose a surface of the silicon substrate and to form isolation layers at both sides of the well. In another embodiment, there is disclosed a method of fabrication a semiconductor device according to the present invention comprises the steps of: providing a first conductive silicon substrate having a pad oxide layer on a side thereof; forming a trench having a width including the active region and field regions at both sides thereof by etching the pad oxide layer and the silicon substrate, forming a first sidewall layer on an inner side of the trench and on the pad oxide layer using an oxidation process, depositing a first oxide layer on the first sidewall to have a thickness similar to the width of the field region; forming a spacer exposing active region of the silicon substrate on both sides of the trench by etching the first oxide layer, forming a second conductive well comprising the doped silicon epi layer and having a facet by growing in-situ a doped silicon epi layer on the exposed active region of the silicon substrate to a height similar to the surface of the silicon substrate; forming a second sidewall on the surface of the well by using an oxidation process, depositing a second oxide layer having a predetermined thickness on the resultant structure to fill a gap between the spacer and the facet of the well, performing a first planarization of the second oxide layer to expose the first sidewall layer, and performing a second planarization of the resultant structure to expose the surface of the well and to form an isolation layer. According to the present invention, the spacer has a width of 80~100% relative to that of the field region. According to the present invention, the silicon epi layer is rapidly grown at a high temperature of 900 to 1050° C. in the profile region perpendicular to the spacer and the silicon epi layer is slowly grown at a low temperature of 700 to 850° C. in a facet formation region; therefore, the upper facet formation layer of the silicon epi layer is thinner than the lower part thereof.

Further according to the present invention, the second oxide layer has a thickness of from 0.2 to 0.9 $\mu$m.

Moreover, according to the present invention, the first planarization is performed by Chemical Mechanical Polishing so that the second oxide layer remains to a thickness of 0.05 to 0.12 $\mu$m from well surface. The second planarization is performed by Wet Dip.

The above objects, and other features and advantages of the present invention will become more apparent after reading the following detailed description when taken in conjunction with the drawings.

DETAILED DESCRIPTION OF THE PREFERRED EMBODIMENTS

A method for fabrication of a semiconductor device according to the present invention will be described below with reference to FIGS. 1A to 1G.

Figure 1A:
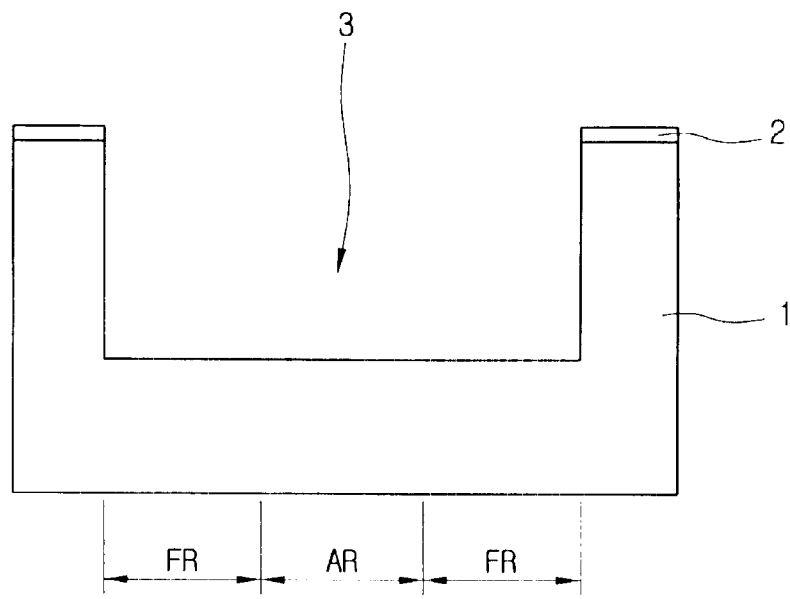
FIGS. 1A to 1G are cross-sectional views for showing a method of fabricating a semiconductor device according to embodiments of the present invention.

Referring to FIG. 1A, a silicon substrate 1 having an active region AR and field regions FR is provided and a pad oxide layer 2 is formed on a side of the silicon substrate 1. After the pad oxide layer 2 is deposited, an ion-implantation process may be performed to increase the dose of the substrate 1. A trench 3 is formed on the silicon substrate 1 by etching the pad oxide layer 2 and the silicon substrate 1 through a well-known photolithography process. Here, the trench 3 has a width including one active region AR and two field regions FR at both sides of the active region AR.

Figure 1B:
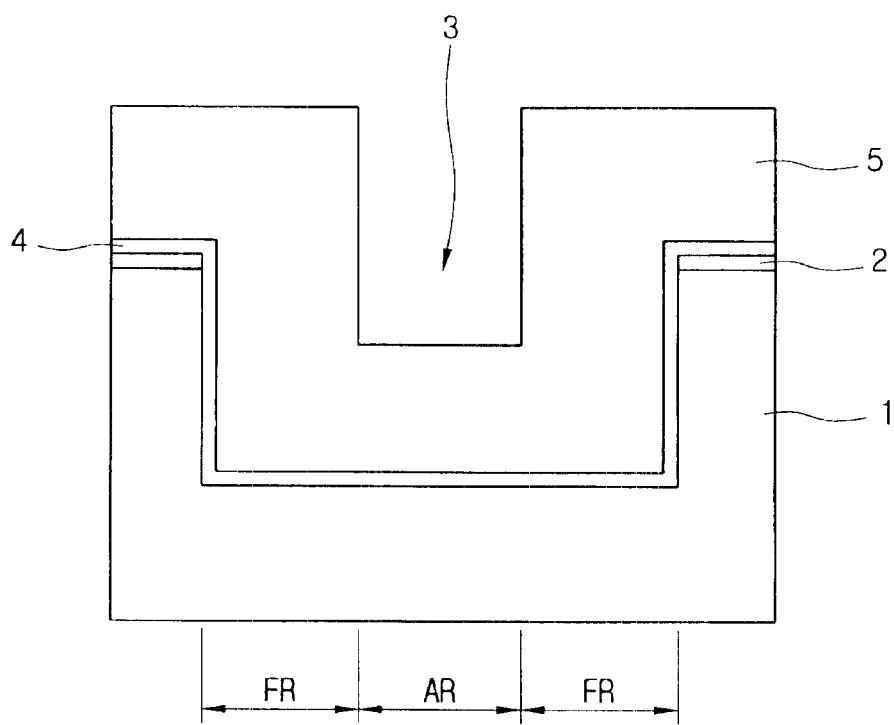

Referring to FIG. 1B, a sidewall treatment to the trench 3, that is, an oxidation process is performed. A first sidewall layer 4 is thus formed on the inner walls of the trench 3. The sidewall treatment is performed to recover etching damage that results during the etching process that forms the trench 3, comprising an oxidation process. The first sidewall layer 4 may be formed as a single layer or as a multi layer. Depending on the desired width of an isolation layer, a first oxide layer 5 is deposited on the sidewall layer 4. The first oxide layer 5 is desirably deposited to a thickness approximately commensurate with the maximum width of the field region FR.

Figure 1C:
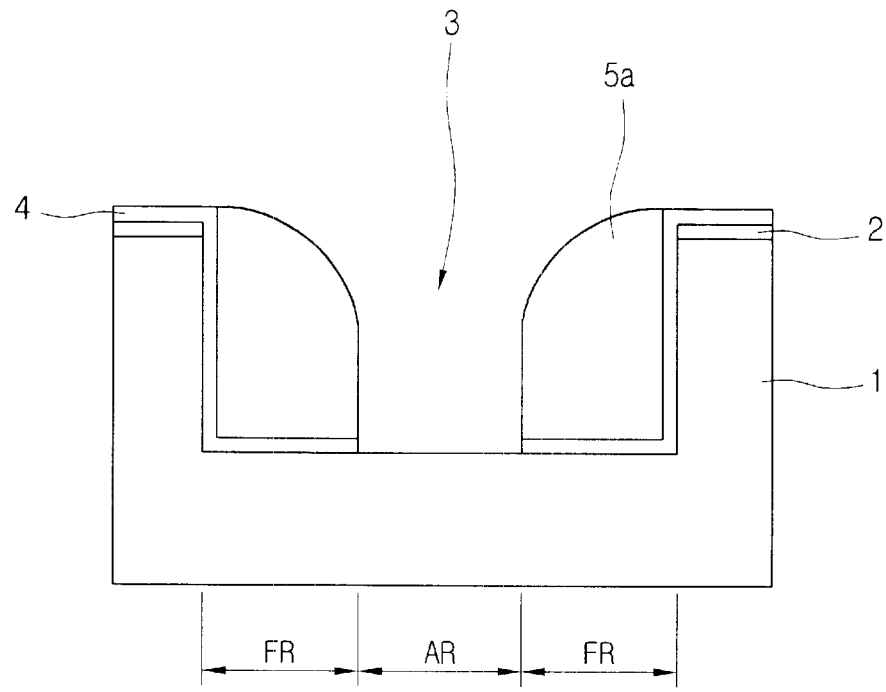

Referring to FIG. 1C, a spacer 5a is formed on both sides of the trench 1 by blanket etching the first oxide layer 5 to a sufficient depth so that the center of bottom of the trench 3, that is, the active region AR, is exposed. Here, the spacer 5a is formed preferably to a thickness of 80 to 100% of the field region FR. The tilt angle of the spacer 5a is controlled in consideration of the well to be formed in a succeeding process. In more detail, a perpendicular profile part of spacer 5a may maximize reproducibility in a succeeding selective epitaxial growth SEG process and a tilted profile part corresponds to a facet formation region during the SEG process.

Figure 1D:
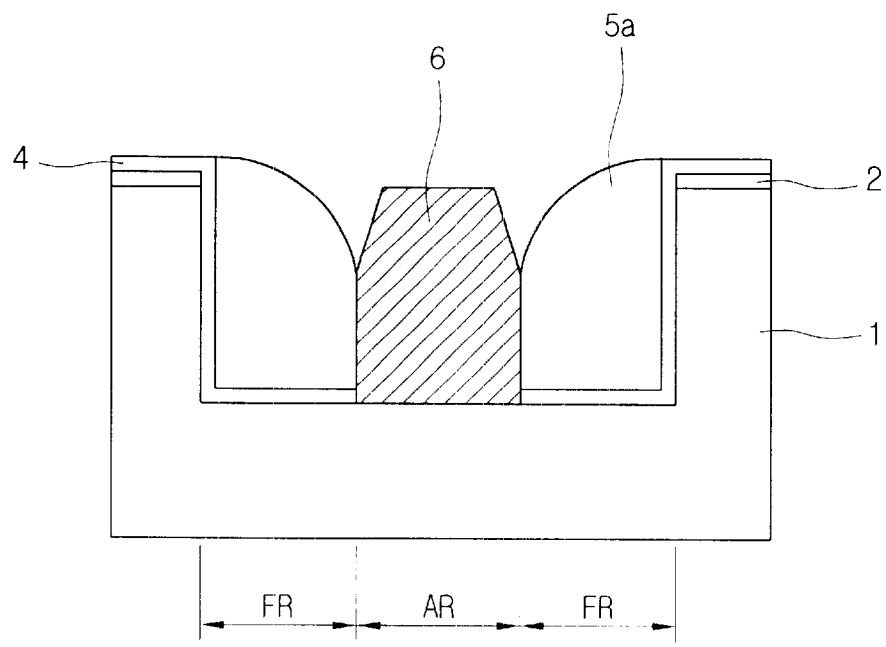

Referring to FIG. 1D, a well 6, comprising a silicon epi layer is formed on the exposed trench region, that is, on the active region AR by using an SEG process. The well 6 is formed to a height similar to a surface of the silicon substrate 1. The SEG process for growing the silicon epi layer is rapidly performed at a high temperature of 900 to 1050° C. in a perpendicular profile region of the spacer 5a and is slowly performed at a low temperature below 850° C., desirably 700 to 850° C. in a facet formation region. Therefore, in the well 6 comprising the silicon epi layer, the upper part of the facet formation region is thinner than the lower part thereof. Moreover, during growth of the silicon epi layer, second conductive impurities opposite to the silicon substrate 1 are doped in-situ so that the well has the second conductive form disposed opposite to the substrate 1.

In the above-method, the well 6 is formed by an in-situ doping SEG process, thereby preventing generation of crystal defects due to ion-implantation. The well 6 maintains uniformity of dopant profile by controlling the concentration of impurities during growth of the silicon epi layer as it is possible to control the dopant profile.

Figure 1E:
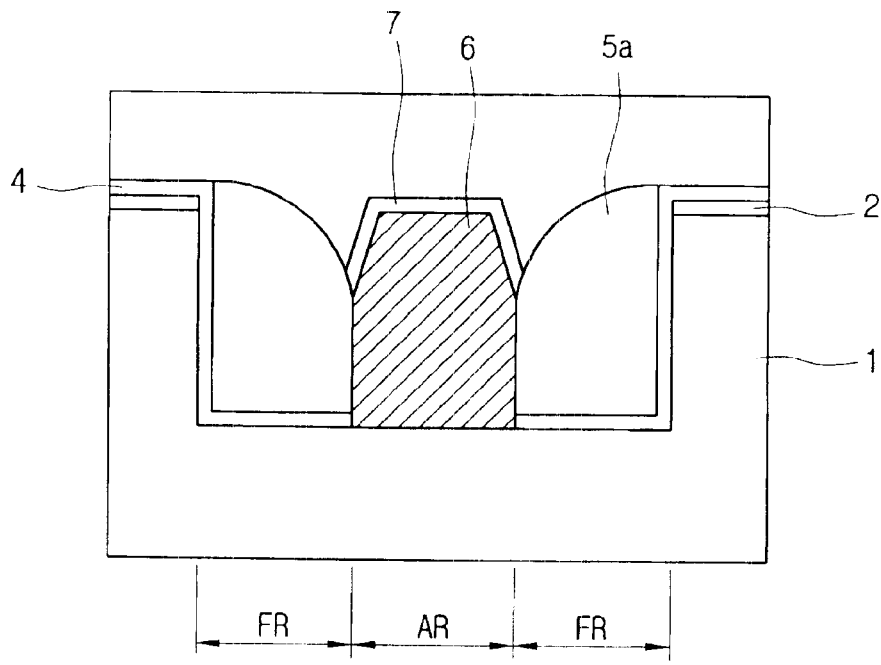

Referring to FIG. 1E, an oxidation process is performed to improve surface morphology of the well 6 and to minimize angled parts easily generating charge concentration. As a result, a second sidewall layer 7 is formed on the surface of the second conductive well 6. A second oxide layer 8 is deposited on the resultant structure to gap-fill the well 6 disposed between the facet of the silicon epi layer and the spacer 5a, the second oxide layer 8 having a relative thickness and taking into consideration a succeeding planarization process. The second oxide layer is desirably deposited to a thickness of 0.2 to 0.9 $\mu$m.

Figure 1F:
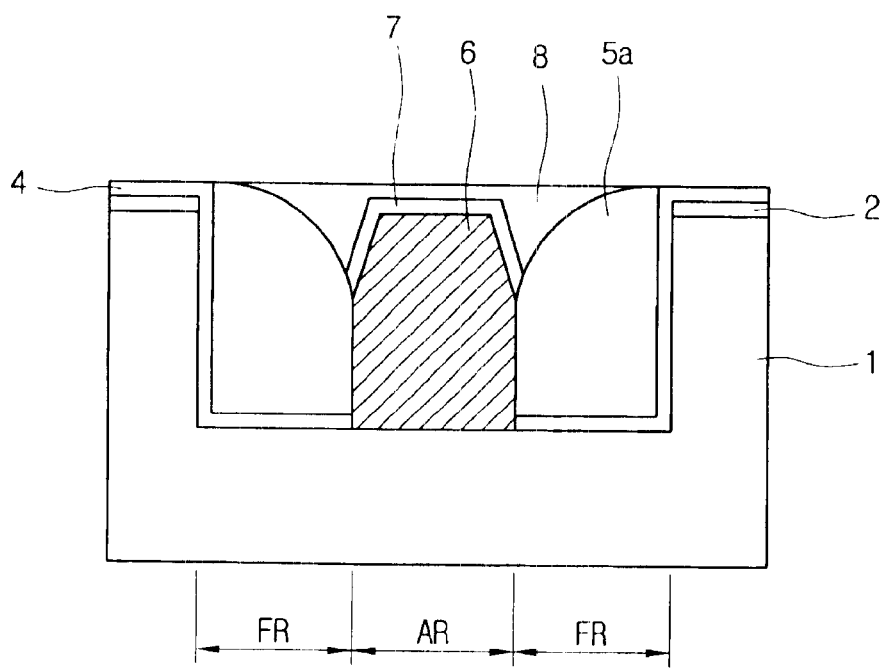

Referring to FIG. 1F, a first planarization is performed to the second oxide layer 8 by using Chemical Mechanical Polishing (CMP) to expose the first sidewall layer 4 formed on the surface of the silicon substrate 1. The first planarization is preferably performed so that the second oxide layer 8 remains 0.05 to 0.12 $\mu$m from the surface of the well 6.

Figure 1G:
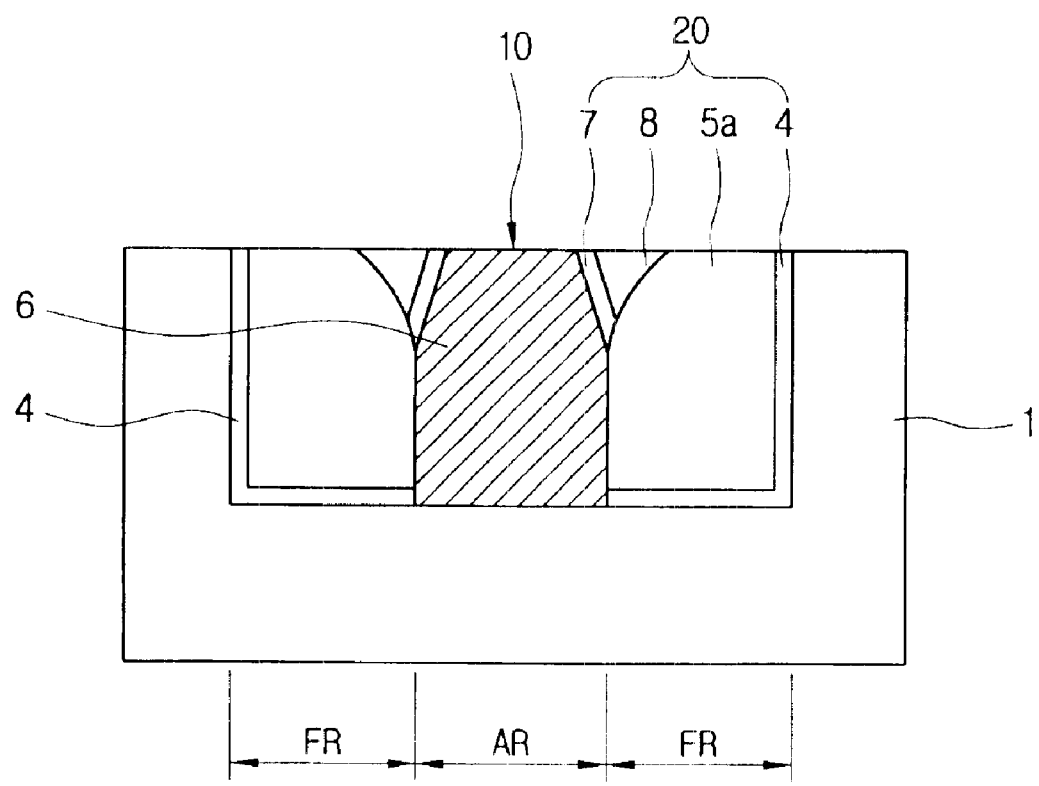

Referring to FIG. 1G, a second planarization is performed to the resultant structure by using wet dip to expose a surface of the silicon substrate 1, thereby forming an isolation layer 20 comprising a first sidewall layer 4, spacer 5a, a second sidewall layer 7 and a second oxide layer 8 at both sides of the well 6.

Here, the isolation layer 20 is generally formed by the spacer 5a, thereby solving difficulties of gap-fill due to large aspect ratio. Accordingly, the process provides a solution to the problems of gap-fill and stress during gap-fill that are generated in STI.

Prior to trench etching, a well of one type is formed during the isolation process and a field is formed by a process similar to the spacer formation process. Then, a well of another type is formed using in-situ doping selective epitaxial growth, thereby respectively treating the interfaces of the N-well field and P-well field. Therefore, it is possible to solve problems of conventional gap-fill process and to respectively perform sidewall treatment to the interface of the N-well and field region and that of the P-well and field region.

Thereafter, although it is not shown, a transistor is formed on the second conductive well 6 comprising a silicon epi layer by a well-known semiconductor fabrication method.

As described above, according to the present inventions a well and an isolation layer are formed by one mask process, thereby simplifying the fabrication process.

The well is formed not by an ion implantation process, but by an in-situ doping SEG process, thereby preventing crystal defects due to ion implantation and which process is capable of controlling the well dopant profile.

Moreover, the isolation layer is formed by an oxide layer spacer, thereby solving those problems of gap-fill and stress during the gap-fill that are due to a large aspect ratio in the conventional STI processes.

Problems due to symmetric gap-fill in isolation process are thus capable of solution, thereby providing the capability of respectively treating the interfaces of the N-well/field and P-well/field.

Complete electric isolation of the N-well and P-well is provided. As a result, the present invention can be advantageously used in fabrication of highly integrated devices.

The invention may be embodied in other specific forms without departing form the spirit or essential characteristics as embodied in the above discussion and accompanying drawings. The embodiments disclosed are therefore to be considered in all respects as illustrative and not restrictive and any changes that come within the meaning and range of equivalency of the claims are therefore intended to be embraced thereby.

What is claimed is:

1. A method for fabricating a semiconductor device comprising:
   providing a first conductive silicon substrate having an active region and field regions thereon and having a formed pad oxide layer on the surface;
   forming a trench having a width including the active region and field regions at both sides of the active region by etching the pad oxide layer and the silicon substrate;
   forming a spacer having a width similar to that of the field region at both sidewalls of the trench and exposing the active region of the silicon substrate;
   forming a second conductive well on the exposed active region of the silicon substrate by growing an in-situ doped silicon epi layer to a height similar to a surface of the silicon substrate;
   depositing an oxide layer on the resultant structure to fill a gap between the spacer and the well; and
   performing planarization of the oxide layer to expose a surface of the silicon substrate and to form isolation layers at both sides of the well.

2. The method for fabricating a semiconductor layer according to claim 1, further comprising a step of forming a first sidewall layer on inner wall of the trench and on the pad oxide layer by an oxidation process between the steps of the trench formation and the spacer formation.

3. The method for fabricating a semiconductor layer according to claim 1, wherein the spacer has a width of 80 to 100% of that of the field region.

4. The method for fabricating a semiconductor layer according to claim 1, wherein the in-situ doped silicon epilayer is grown to have a facet formation region.

5. The method for fabricating a semiconductor layer according to claim 4, wherein the silicon epi layer is rapidly grown at a high temperature of 900 to 1050° C. in a perpendicular profile region of the spacer and is slowly grown at a low temperature of 700 to 850° C. in a facet formation region.

6. The method for fabricating a semiconductor layer according to claim 4, wherein the silicon epi layer is grown so that the upper part of the facet formation region is thinner than the lower part thereof.

7. The method for fabricating a semiconductor layer according to claim 1, further comprising a step of forming a second sidewall layer on the surface of well by an oxidation process between the steps of the well formation and the oxide layer formation.

8. The method for fabricating a semiconductor layer according to claim 1, wherein the oxide layer is deposited to have a thickness of 0.2 to 0.9 $\mu$m.

9. The method for fabricating a semiconductor layer according to claim 1, wherein the step of oxide layer planarization comprises two planarizations.

10. The method for fabricating a semiconductor layer according to claim 9, wherein the first planarization is performed using Chemical Mechanical Polishing so that the oxide layer remain to 0.05 to 0.12 $\mu$m from the surface of the well.

11. The method for fabricating a semiconductor layer according to claim 9, wherein the second planarization is performed by Wet Dip.

12. A method for fabricating a semiconductor device comprising:
   providing a first conductive silicon substrate having an active region and field regions thereon and having a formed pad oxide layer on the surface;
   forming a trench having a width and including an active region and field regions at both sides of the active region by etching the pad oxide layer and the silicon layer;
   forming a first sidewall layer on the inner wall of the trench and on the pad oxide layer by an oxidation process;
   depositing a first oxide layer on the first sidewall layer to have a thickness similar to the width of the field region;
   forming a spacer exposing the active region of the silicon substrate at both sidewalls of the trench by etching the first oxide layer;
   forming a second conductive well by growing an in-situ doped silicon epi layer having a height similar to a surface of the silicon substrate on the exposed active region of the silicon substrate;
   forming a second sidewall layer on the surface of the well by an oxidation process;
   depositing a second oxide layer having a predetermined thickness on the resultant structure to fill a gap between the spacer and the well;

performing a first planarization to the second oxide layer to expose the first sidewall layer; and performing a second planarization to the resultant structure to expose the surface of the well and to form an isolation layer.

13. The method for fabricating a semiconductor device according to claim 12, wherein the spacer has a width of 80 to 100% of that of the field region.

14. The method for fabricating a semiconductor device according to claim 12, wherein the in-situ doped silicon epi layer is grown to have a facet formation region.

15. The method for fabricating a semiconductor device according to claim 14, wherein the silicon epi layer is rapidly grown at a high temperature of 900 to 1050° C. in a perpendicular profile region of the spacer and is slowly grown at a low temperature of 700 to 850° C. in a facet formation region.

16. The method for fabricating a semiconductor device according to claim 15, wherein the upper part of the facet formation region is thinner than the lower part thereof in the silicon epi layer.

17. The method for fabricating a semiconductor device according to claim 12, wherein the second oxide layer is deposited to a thickness of 0.2 to 0.9 $\mu$m.

18. The method for fabricating a semiconductor device according to claim 12, wherein the first planarization is performed by Chemical Mechanical Polishing so that the second oxide layer remains at a thickness of between 0.05 to 0.12 $\mu$m from the surface of well.

19. The method for fabricating a semiconductor device according to claim 12, wherein the second planarization is performed by Wet Dip.

20. The method for fabricating a semiconductor device according to claim 12, wherein the isolation layer comprises a first sidewall layer, a spacer, a second sidewall layer and a second oxide layer.

* * * * *